United States Patent
Borrel et al.

(10) Patent No.: US 10,560,089 B2
(45) Date of Patent: Feb. 11, 2020

(54) ELECTRONIC CIRCUIT WITH DEVICE FOR MONITORING A POWER SUPPLY

(71) Applicant: STMicroelectronics (Rousset) SAS, Rousset (FR)

(72) Inventors: Nicolas Borrel, Martigues (FR); Jimmy Fort, Puyloubier (FR); Francesco La Rosa, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/161,531

(22) Filed: Oct. 16, 2018

(65) Prior Publication Data
US 2019/0123736 A1    Apr. 25, 2019

(30) Foreign Application Priority Data

Oct. 20, 2017 (FR) ...................................... 17 59915

(51) Int. Cl.
*H03L 5/02* (2006.01)
*H03K 17/20* (2006.01)
*H03K 17/22* (2006.01)

(52) U.S. Cl.
CPC ............... *H03K 17/22* (2013.01); *H03L 5/02* (2013.01)

(58) Field of Classification Search
CPC combination set(s) only.
See application file for complete search history.

(56) References Cited

U.S. PATENT DOCUMENTS

| 5,920,182 A | 7/1999 | Migliavacca | |
| 7,274,250 B2* | 9/2007 | Hazucha | G05F 3/30 |
| | | | 327/539 |
| 7,570,090 B2* | 8/2009 | Du | G06F 1/24 |
| | | | 327/143 |
| 7,876,135 B2* | 1/2011 | Shkidt | H03K 17/22 |
| | | | 327/142 |
| 8,928,374 B2* | 1/2015 | Matsuno | H03L 5/02 |
| | | | 327/143 |
| 9,639,133 B2* | 5/2017 | Shor | G05F 3/30 |
| 2005/0030090 A1 | 2/2005 | Deng | |

(Continued)

FOREIGN PATENT DOCUMENTS

FR   3001060 A1   7/2014

OTHER PUBLICATIONS

INPI Search Report and Written Opinion for FR 1759915 dated Jun. 12, 2018 (8 pages).

*Primary Examiner* — An T Luu
(74) *Attorney, Agent, or Firm* — Crowe & Dunlevy (57) ABSTRACT

A power supply voltage is monitored by a monitoring circuit including a band gap voltage generator core including a first node and a second node. A control circuit connected to the first and second nodes is configured to deliver a control signal on a first output node having a first state when an increasing power supply voltage is below a first threshold and having a second state when increasing power supply voltage exceeds the first threshold. The first threshold is at least equal to the band gap voltage. An equalization circuit also connected to the first and second nodes with feedback to the band gap voltage generator core generates the bandgap voltage at a second output node. The control signal operates to control actuation of the equalization circuit.

34 Claims, 5 Drawing Sheets

(56) References Cited

U.S. PATENT DOCUMENTS

| | | | |
|---|---|---|---|
| 2007/0046341 A1* | 3/2007 | Tanzawa | H03K 17/14 |
| | | | 327/143 |
| 2009/0219066 A1 | 9/2009 | Shkidt | |
| 2012/0176186 A1 | 7/2012 | Chen et al. | |
| 2014/0253191 A1 | 9/2014 | Matsuno | |
| 2015/0042386 A1* | 2/2015 | Bhowmik | H03K 17/223 |
| | | | 327/143 |
| 2017/0244406 A1 | 8/2017 | Yasunaka | |
| 2019/0123737 A1* | 4/2019 | Fort | H03K 17/223 |

\* cited by examiner

ELECTRONIC CIRCUIT WITH DEVICE FOR MONITORING A POWER SUPPLY

PRIORITY CLAIM

This application claims the priority benefit of French Application for Patent No. 1759915, filed on Oct. 20, 2017, the content of which is hereby incorporated by reference in its entirety to the maximum extent allowable by law.

TECHNICAL FIELD

Embodiments relate to integrated circuits, and in particular to managing the start-up and operation of the integrated circuits as a function of the power supply voltage.

BACKGROUND

In order to avoid integrated circuit malfunctions, there are devices that make it possible to delay the start-up of an electronic circuit until the power supply voltage of the circuit has reached a first threshold.

These devices can also switch off the integrated circuit if the power supply voltage falls below a second threshold, the second threshold conventionally being able to be equal to or lower than the first threshold.

These devices are known to the person skilled in the art as "Power On Reset circuits" (POR circuits).

However, the existing systems present certain drawbacks, in particular an excessive error margin, of the order of 10 to 20%. This error margin can moreover vary as a function of the temperature, of the voltage threshold, or of the technology of the integrated circuit.

There is therefore a need to improve this type of device.

SUMMARY

Thus, according to one embodiment, a device is proposed for monitoring the power supply of an integrated circuit, having a high level of accuracy and insensitive to change of temperature, of voltage threshold or of fabrication method.

According to one aspect, an electronic circuit is proposed comprising a power supply node configured to receive a power supply voltage, a first output node and a reference node configured to receive a reference voltage, and comprising a device for monitoring the power supply voltage.

The monitoring device comprises a band gap voltage generator core coupled to the power supply node via a voltage power supply module configured to supply the core with voltage, the core comprising a first node and a second node.

The monitoring device further comprises a control circuit connected to the two nodes of the core and to the first output node.

The core and the control circuit are configured so that the control circuit delivers, on the first output node, a control signal having a first state when the power supply voltage increases and remains below a first threshold, and a second state when the power supply voltage becomes greater than or equal to the first threshold, the first threshold being at least equal to the band gap voltage.

When the voltage at the power supply node reaches the first threshold, the voltages at the two nodes of the core are equal. As a function of the structure of the current power supply, the first threshold can be equal to the band gap voltage (typically 1.2 Volts) or greater than this band gap voltage, for example between 1.2 Volts and 1.4 or 1.5 Volts.

A voltage of 1.2 Volts can therefore be advantageously used in some cases as the voltage threshold of the device.

Furthermore, the core allows for a particularly accurate detection of the voltage threshold, being insensitive to the variations of temperature, of fabrication method or of voltage threshold.

The voltage power supply module can comprise the power supply node coupled to an intermediate node through which the core is supplied with voltage.

The circuit can be configured so that the intermediate node receives the power supply voltage, the first threshold being equal to the band gap voltage. Such is the case when the intermediate node is directly coupled to the power supply node, or else coupled to the power supply node, for example, via a follower amplifier.

That said, the voltage power supply module can comprise a resistive module coupled between the power supply node and the intermediate node, the first voltage threshold then being greater than or equal to the band gap voltage.

Thus, it is advantageously possible to modify the first voltage threshold by adjusting the resistance value of the resistive module.

A core structure that is particularly simple to produce and small in terms of surface area uses PNP transistors and three resistors. This preferred example that makes it possible to easily reduce the first voltage threshold to the band gap voltage by dispensing with the resistive module is however of course non-limiting, other core structures being able to be envisaged.

More specifically, according to this non-limiting example, the core comprises two branches respectively coupled to the two nodes and respectively comprising diode-mounted PNP bipolar transistors configured to exhibit different current densities, the branch exhibiting the greatest current density further comprising a first resistor. The core also comprises two auxiliary resistors respectively connected to the two nodes of the core and having a common node forming said intermediate node.

The control circuit can be configured to deliver the control signal in its first state when the power supply voltage drops back below the first threshold.

According to one embodiment, the control circuit comprises a first comparator of which a first input is coupled to the first node, of which a second input is coupled to the second node, and of which the output is coupled to the first output node.

According to one embodiment, the circuit can comprise a band gap voltage generator incorporating the core, having an equalization circuit that can be activated by the control signal, and a second output node, the equalization circuit being deactivated when the control signal is in its first state, and activated when the control signal is in its second state, the second output node being able to deliver the band gap voltage when the equalization circuit is activated.

Thus, one and the same core is used for the device and for the band gap voltage generator, which advantageously allows for a saving on surface area compared to a circuit in which the device and the band gap voltage generator would each use a distinct core.

It should be noted here that this aspect providing for the use of the same core for, on the one hand, a band gap voltage generator with activatable equalization circuit and for, on the other hand, a device for monitoring the power supply voltage, is compatible with any core structure, regardless of the value of the first threshold, whether this value is equal to the band gap voltage or greater than this band gap voltage.

According to one embodiment, the control circuit comprises a second comparator of which a first input is coupled to the first node, of which a second input is coupled to the second node, and of which the output is configured to generate a first signal having a first state when the power supply voltage is greater than or equal to the first voltage threshold, and a third comparator of which a first input is coupled to the second output node, of which a second input is coupled to the power supply node, and of which the output is configured to generate a second signal having the second state when the power supply voltage is greater than or equal to the first threshold, the device further comprising a logic gate of AND type of which a first input is coupled to the output of the second comparator, of which a second input is coupled to the output of the third comparator via an inverting logic gate, and of which the output is coupled to the first output node.

That advantageously makes it possible to generate a control signal when the power supply voltage drops back below the voltage threshold, despite the presence of the amplifier of the band gap voltage generator which has a higher gain than that of the first comparator.

The control circuit can be configured to deliver the control signal in its first state when the power supply voltage drops back below a second threshold lower than the first threshold.

The second input of the second comparator can be coupled to the power supply node via a voltage divider bridge, so that the third comparator is configured to generate the second signal in the first state when the power supply voltage is greater than or equal to a second voltage threshold, the second voltage threshold being lower than the first voltage threshold.

The use of voltage thresholds which are different in the rising and in the falling of the power supply voltage confers a hysteresis-like behavior on the device and advantageously makes it possible to avoid oscillation phenomena which could occur with the use of one and the same threshold.

DETAILED DESCRIPTION

Figure 1:
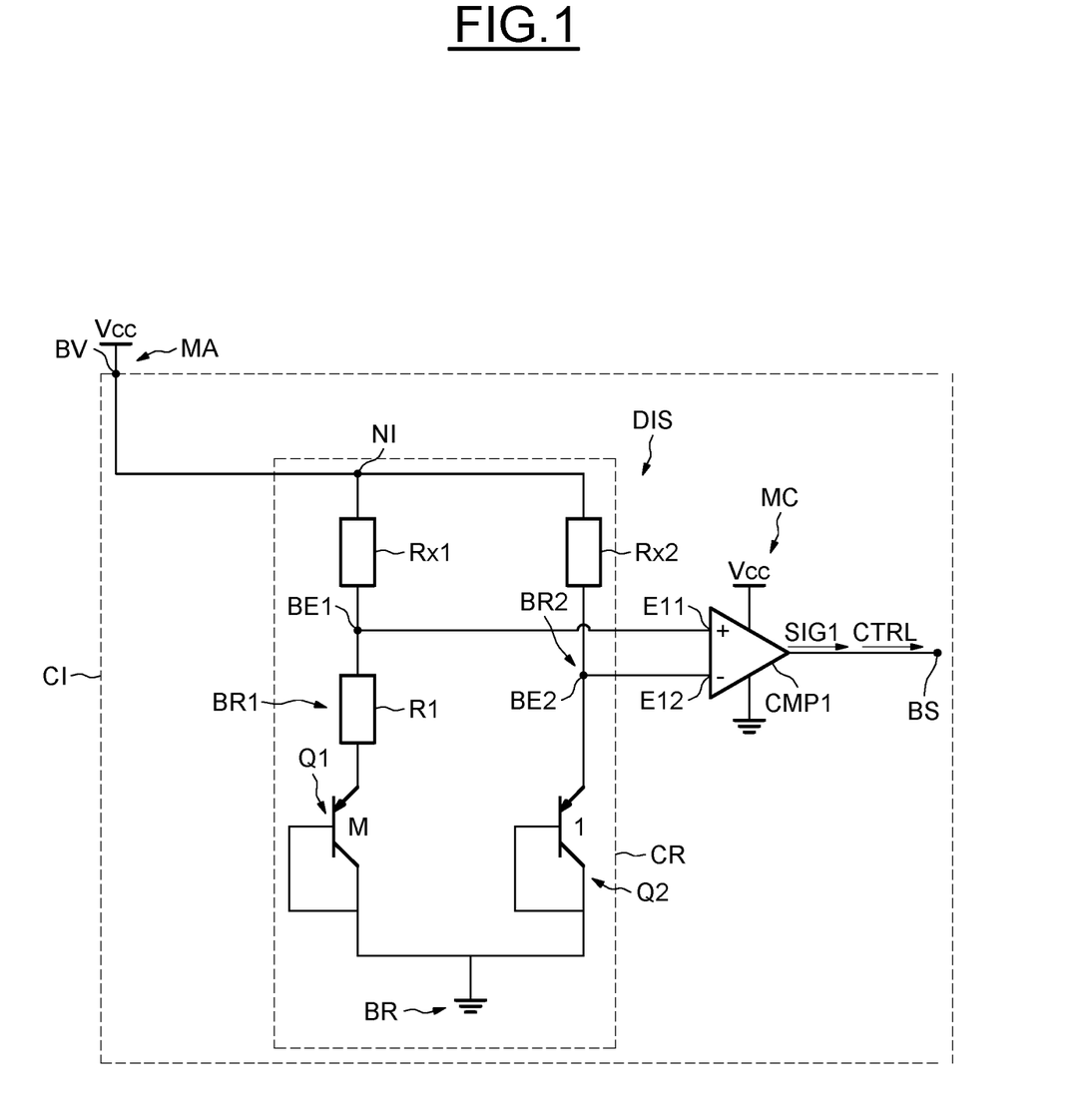
FIGS. 1 to 5 show embodiments for an electronic circuit comprising a device for monitoring a general power supply.

FIG. 1 illustrates an electronic circuit CI comprising a device DIS for monitoring the general power supply of the circuit CI, configured to generate a control signal CTRL at an output node BS, intended for the integrated electronic circuit CI.

The state of the control signal CTRL changes as a function of the value of the general power supply voltage Vcc of the circuit CI, and allows the circuit CI to operate only if the power supply voltage Vcc is above a first threshold that is here, for example, 1.2 Volts.

The control signal CTRL can be in a first state, for example a low state, or in a second state, for example a high state, and the circuit CI is configured to operate when the control signal CTRL is in its second state, and to be switched off when the control signal CTRL is in its first state.

The device DIS is configured to generate the control signal CTRL having the second state when the voltage at the power supply node BV is greater than or equal to the first voltage threshold.

Here, the general power supply voltage Vcc of the integrated circuit CI is supplied by a battery (not represented), coupled to a power supply node BV of the integrated circuit CI.

The device DIS is coupled to the power supply node BV via a voltage power supply module MA configured to deliver the power supply voltage Vcc to an intermediate node NI. The voltage power supply module here only comprises the power supply node BV.

The device DIS comprises a core circuit CR, comprising a first node BE1 and a second node BE2.

The core circuit CR here comprises a first PNP bipolar transistor, referenced Q1, diode-mounted and connected in series with a first resistor R1, here with a value of 1 mega ohm, between the first node BE1 and a reference node BR, intended to be supplied by a reference voltage, here the ground. The first transistor Q1 connected in series with the first resistor R1 here forms a first branch BR1 of the core circuit CR.

The core circuit CR also comprises a second PNP bipolar transistor referenced Q2, also diode-mounted, and connected between the second node BE2 of the core circuit and the reference node BR. The second transistor Q2 coupled between the second node BE2 and the reference node BR here forms a second branch BR2 of the core circuit CR.

The size of the first transistor Q1 and the size of the second transistor Q2 are different, and are in a surface ratio M, such that the current density passing through the second transistor Q2 is M times greater than the current density passing through the first transistor Q1.

For example here, the size of the first transistor Q1 is eight times greater than the size of the second transistor Q2.

Obviously, it would also be possible to use a transistor Q2 and M transistors Q1 in parallel, all of the same size as the second transistor Q2.

The core circuit CR further comprises a first auxiliary resistor Rx1 coupled between the intermediate node N1 and the first node BE1, and a second auxiliary resistor Rx2 coupled between the intermediate node N1 and the second node BE2. Here, the first auxiliary resistor Rx1 and the second auxiliary resistor Rx2 both have a value of 10 mega ohms.

The core circuit CR of the device DIS is here analogous to a band gap voltage generation device circuit.

As is known to the person skilled in the art, a band gap voltage generator conventionally comprises, in addition to a core circuit analogous to the core circuit CR described previously, an equalization circuit comprising an amplifier and a feedback stage configured to equalize the voltage at the first node BE1 and at the second node BE2 of the core circuit CR. And, when the voltage at the first node BE1 is equal to the voltage at the second node BE2, the voltage at the intermediate node NI is a band gap voltage equal to the sum of the voltages at the first node BE1 and at the second node BE2, conventionally 1.2 Volts.

A band gap voltage is independent of temperature.

Thus, the equalization circuit makes it possible to keep the voltages equal at the first and second nodes BE1 and BE2, and therefore maintain a band gap voltage at the intermediate node NI.

Specifically, it is known to the person skilled in the art that, when the voltages at the first and second nodes BE1 and BE2 are equal, the voltage at the intermediate node NI is a voltage equal to 1.2 Volts.

That is possible with a ratio between the value of the first resistor R1 and the value of the auxiliary resistors Rx1 and Rx2 of the order of 10. For example, the first resistor R1 has a value of 1 mega ohm.

Here, the device DIS does not comprise a feedback stage or an amplifier, the voltages at the first node BE1 and at the second node BE2 are not therefore kept equal.

The device DIS comprises control circuit MC, here comprising a first comparator CMP1 of which a first input E11 is coupled to the first node BE1, a second input E12 is coupled to the second node BE2, and of which the output is coupled to the output node BS of the device DIS.

The first comparator CMP1 is here configured to generate the control signal CTRL in its second state when the voltage at the first node BE1 is greater than or equal to the voltage at the second node BE2.

In other words, the first comparator CMP1 generates the control signal CTRL having its first state when the power supply voltage has reached the first threshold.

In operation, on starting up the general power supply, the voltage Vcc increases progressively to its maximum value.

In a first phase, the voltage Vcc is lower than the first threshold, and the voltage at the first node BE1 is lower than the voltage at the second node BE2.

As the power supply voltage Vcc approaches the first threshold, the difference between the voltage at the first node BE1, that is to say on the first input E11 of the first comparator CMP1, and the voltage at the second node, that is to say on the second input E12 of the first comparator CMP1, decreases.

A second phase begins when the value of the power supply voltage Vcc reaches the first threshold, here a band gap voltage value conventionally equal to 1.2 Volts. The voltages at the nodes BE1 and BE2 are then equal.

The power supply voltage Vcc continues to increase from the first threshold to its maximum value, at which it stabilizes. In this second phase, the voltage at the first node BE1 is therefore equal, then greater than the voltage at the second node BE2.

The first comparator CMP1 therefore delivers the control signal CTRL which therefore takes its second state and the electronic circuit CI starts its operation.

And, during the operation of the integrated circuit CI, it is possible, because of a malfunction, for the power supply to drop abruptly. In the case where the power supply voltage Vcc drops below the first threshold, that is to say also if the voltage at the first node BE1 once again becomes lower than the voltage at the second node BE2, the first comparator CMP1 delivers the control signal CTRL in its first state and the integrated circuit CI stops its operation.

It is therefore possible here to ensure that the integrated circuit CI does not operate if the power supply voltage Vcc is too low.

Furthermore, the use of the core circuit CR, analogous to a band gap voltage generator core, makes it possible to obtain the first threshold with a high level of accuracy.

As an indication, the Inventors have observed that the value of the first threshold is respected with a margin of error of the order of 1 to 3%.

Figure 2:
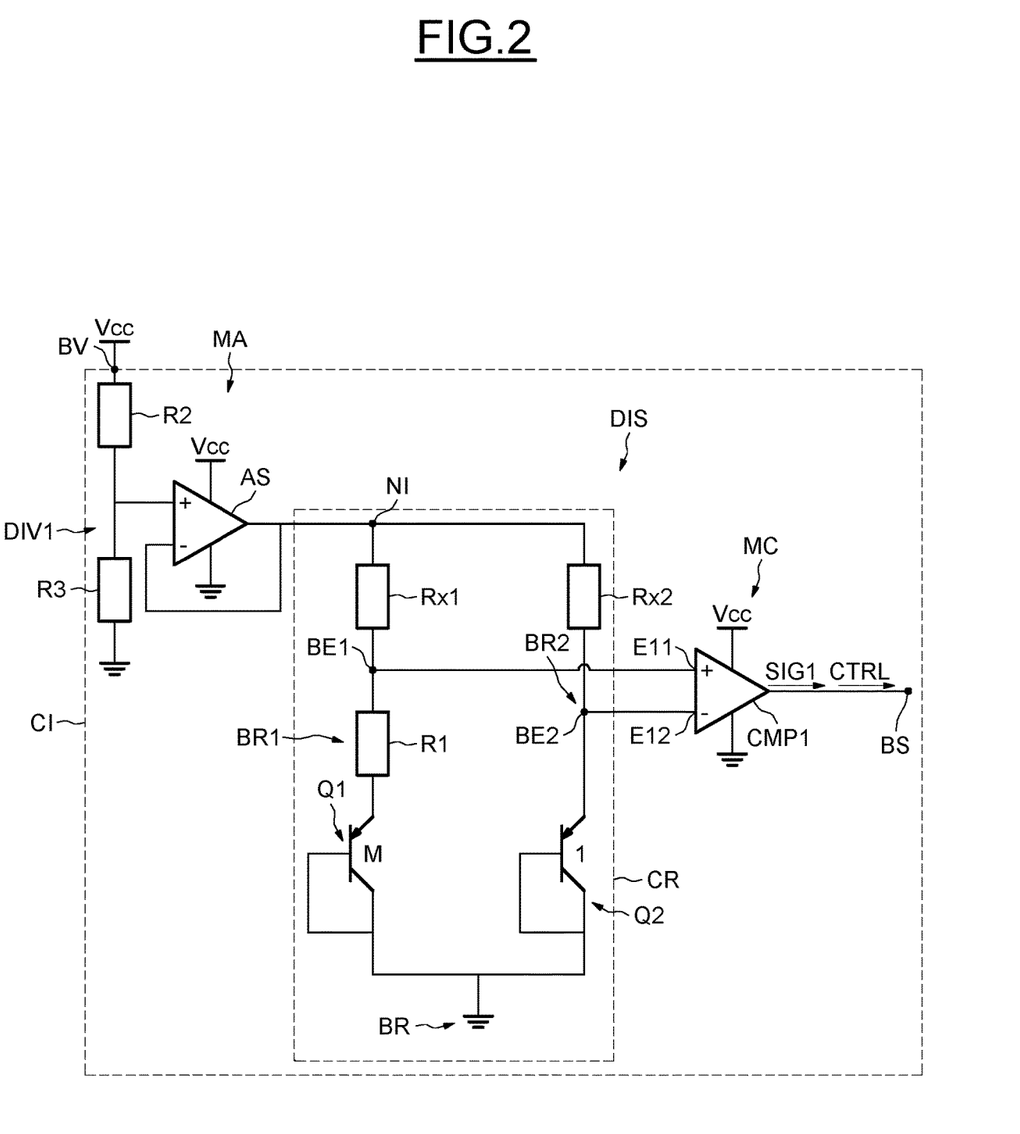

In order to modify the value of the first voltage threshold, it would also be possible, as illustrated in FIG. 2, for the voltage power supply module MA to comprise a follower amplifier AS, configured to deliver the power supply voltage Vcc to the intermediate node NI, and a resistive module, here a first voltage divider bridge DIV1 comprising a second resistor R2 coupled between the power supply node BV and the follower amplifier AS and a third resistor R3 coupled between the second resistor R2 and the ground.

The follower amplifier AS advantageously makes it possible to isolate the device DIS of the resistive module in terms of current.

It would however be possible for the voltage power supply module to comprise only the power supply node BV and the resistive module.

It is thus possible, as a function of the value of the second resistor R2 and of the third resistor R3, to choose the first voltage threshold at the power supply node.

That said, it should be noted that this voltage threshold cannot be lower than 1.2 Volts, that is to say the first threshold when the value of the second resistor R2 is zero.

In other words, if the second resistor R2 and the third resistor R3 are zero, the circuit will start its operation when the voltage Vcc reaches a value of 1.2 Volts.

If the resistors R2 and R3 are not zero, the circuit will start its operation when the power supply voltage Vcc reaches a value greater than 1.2 Volts, this value depending on the values of the second and third resistors R2 and R3. More specifically, this value of the first threshold is equal to $1.2*(R2+R3)/R3$.

Figure 3:
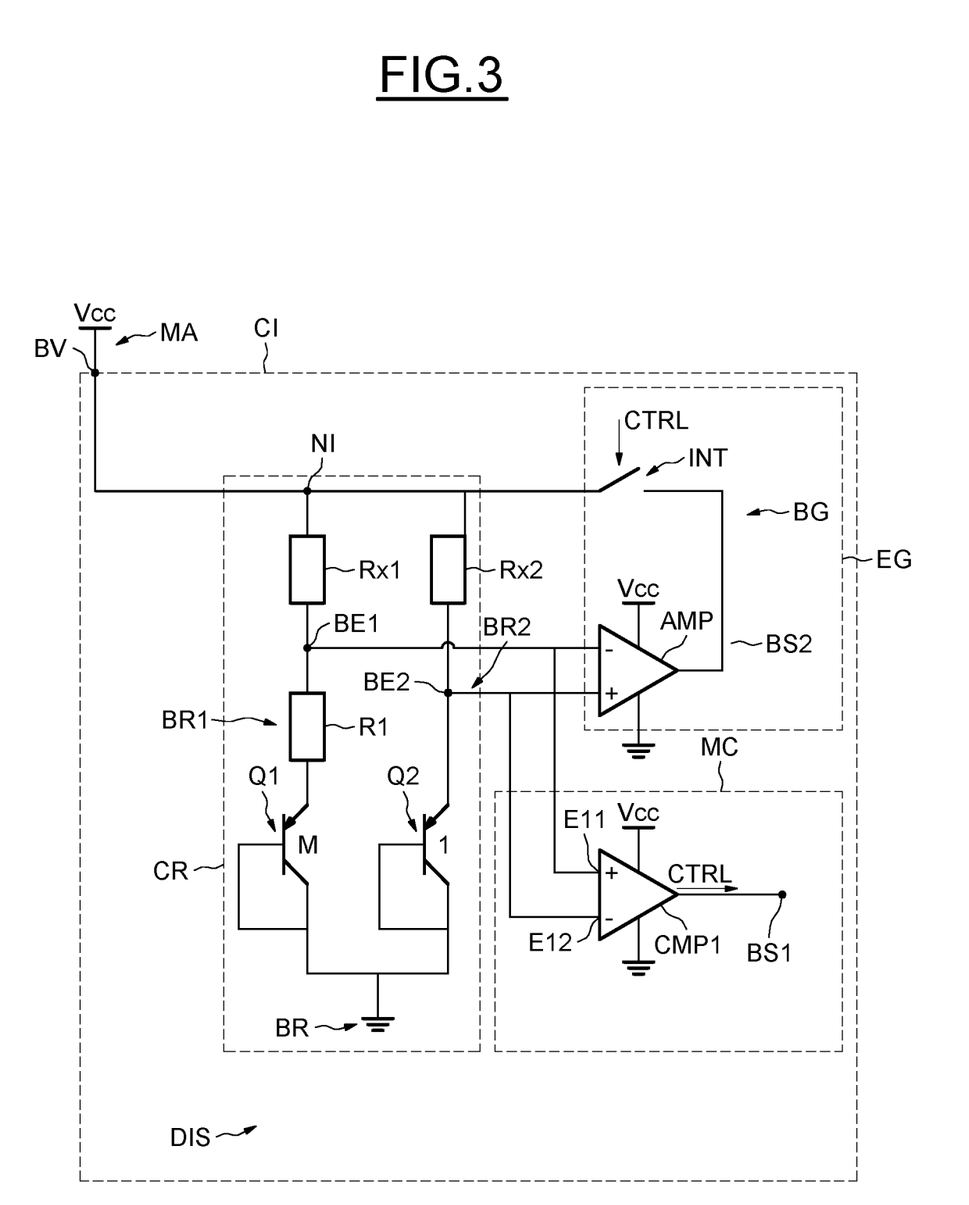

FIG. 3 illustrates an embodiment in which the core circuit CR of the device DIS is part of a band gap voltage generator BG.

The band gap voltage generator BG comprises the core circuit CR, and equalization circuit EG comprising an amplifier AMP whose non-inverting input is coupled to the first node BE1 of the core circuit CR, and whose inverting input is coupled to the second node BE2 of the core circuit CR, and a second output node BS2.

The equalization circuit EG comprise a coupling between the output of the amplifier AMP, coupled here to the second output node BS2, and the intermediate node NI via a switch INT controlled by the control signal CTRL. The switch INT is configured to be in an open state when the control signal CTRL is in its first state, and in a closed state when the control signal CTRL is in its second state.

Likewise, the amplifier AMP can be activated by the control signal CTRL and is configured to be activated when the control signal CTRL is in its second state.

In operation, when the power supply voltage reaches the first threshold, the first comparator CMP1 delivers the control signal CTRL in its second state at a first output node BS1, the amplifier AMP is activated, and the switch INT is closed. The second output node BS2 therefore delivers a band gap voltage Vbg.

In order to avoid oscillation phenomena when the value of the power supply voltage crosses the voltage threshold, the first comparator CMP1 is, here, a hysteresis comparator.

It is thus possible to use an existing band gap voltage generator core in the integrated circuit to produce the device DIS. This advantageously allows a surface saving on the device, compared to a circuit comprising a band gap voltage generator which would be separate from the device DIS.

That being the case, the first comparator CMP1, the follower amplifier AS, and the amplifier AMP operate simultaneously, but, since the amplifier AMP has a higher gain, it imposes the band gap voltage on the intermediate node NI, here 1.2 Volts. The voltages at the first node BE1 and at the second node BE2 are therefore kept equal by the amplifier AMP.

Thus, if the power supply voltage Vcc decreases, for example so as to pass once again below the first threshold, the voltages at the first and second nodes BE1 and BE2 do not vary, and therefore the output of the first comparator CMP1 is not able to deliver the control signal CTRL in its first state.

Figure 4:
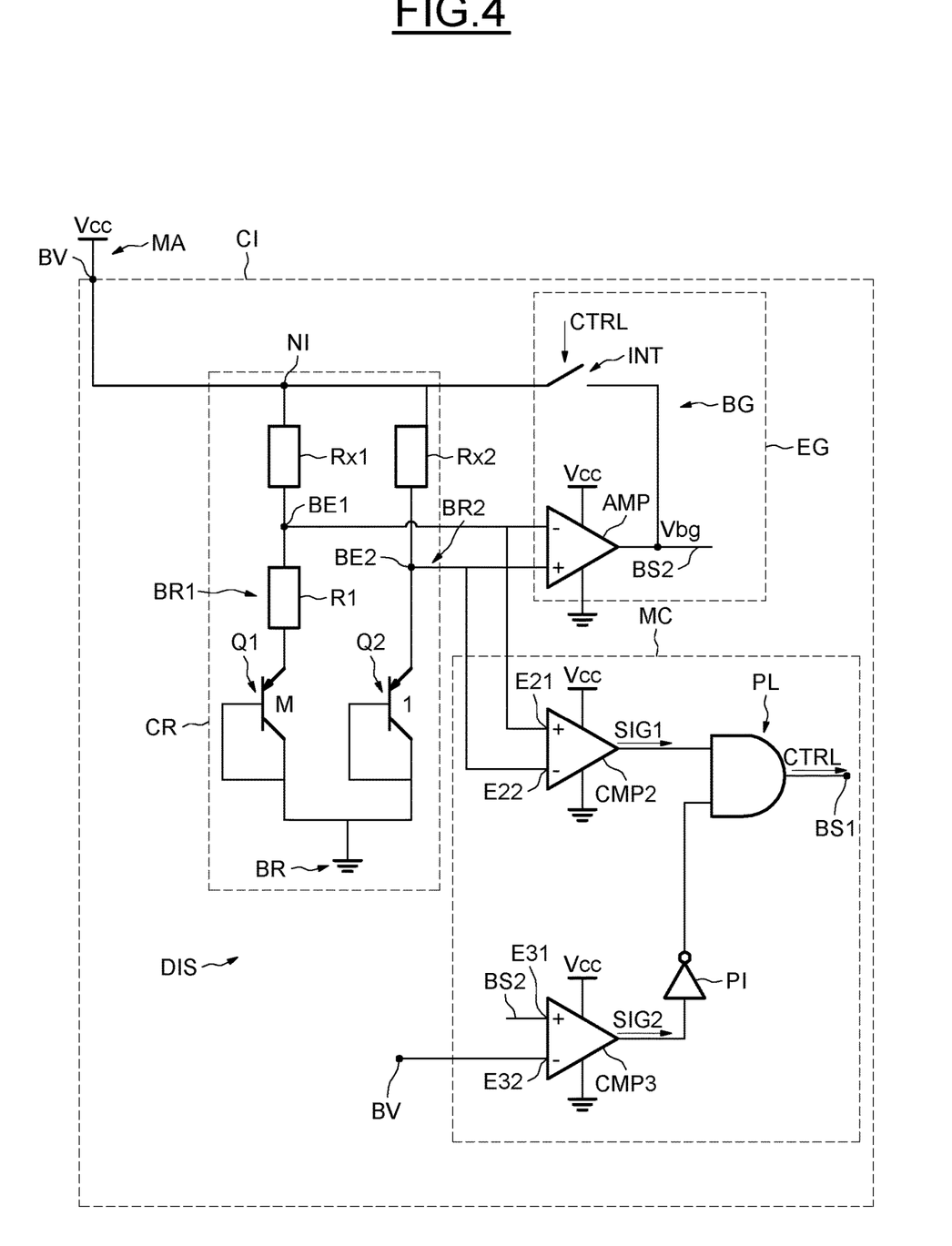

It is not therefore possible to detect a drop in the power supply voltage Vcc in which the power supply voltage Vcc would once again pass below the first threshold. In order to be able to detect such a voltage drop, it is possible, as illustrated by FIG. 4, for the comparison circuit MC to comprise, in place of the first comparator CMP1, a second comparator CMP2 of which a first input E21 is coupled to the first node BE1, a second input E22 is coupled to the second node BE2, and a third comparator CMP3, of which a first input E31 is coupled to the second output node BS2, and of which a second input E32 is coupled to the power supply node BV so as to receive the power supply voltage Vcc.

In order to avoid oscillation phenomena when the value of the power supply voltage crosses the voltage threshold, the second and third comparators CMP2 and CMP3 are, here, hysteresis comparators.

Furthermore, the amplifier AMP and the third comparator CMP3 can be activated by the control signal CTRL.

In particular, when the control signal CTRL is in its first state, the amplifier AMP and the third comparator CMP3 are deactivated, and when the control signal CTRL is in its second state, the amplifier AMP and the third comparator CMP3 are activated.

The second comparator CMP2 is configured to deliver a first signal SIG1 having a first state, here a low state, if the power supply voltage is lower than the first voltage threshold, that is to say if the voltage at the first node BE1 is lower than the voltage at the second node BE2, and having a second state, here a high state, if the power supply voltage is greater than or equal to the first voltage threshold, that is to say if the voltage at the first node BE1 is greater than or equal to the voltage at the second node BE2.

The third comparator CMP3 is configured to, when it is activated, deliver the second signal SIG2 having a first state, here a low state, if the voltage on its second input E32, here the power supply voltage Vcc, is greater than or equal to the voltage on its second input, here the voltage on the second output node BS2, and to deliver the second signal SIG2 in a second state, here a high state, if the voltage on its second input E32 is lower than the voltage on its first input E31.

When the third comparator CMP3 is deactivated, its output delivers a low state. For example, the output of the third comparator CMP3 can be coupled to a circuit comprising pull-down transistors that can be activated by the control signal CTRL.

The second comparator CMP2 and the third comparator CMP3 here each have their output coupled to the input of a logic gate PL.

The logic gate PL has its output coupled to the first output node BS1 of the device DIS, and is configured to deliver the control signal CTRL.

In operation, for example on start-up of the circuit CI, the power supply voltage Vcc increases progressively to its maximum value.

In a first phase, during which the power supply voltage Vcc increases while remaining below the first threshold, the voltage at the first node BE1 is lower than the voltage at the second node BE2, and the second comparator CMP2 delivers the first signal SIG1 in its first state.

The third comparator CMP3 is deactivated and delivers a low state. The inverting gate PI therefore delivers a high state at the input of the logic gate PL.

Thus, the states of the two inputs of the logic gate PL of AND type are different, the logic gate PL therefore delivers the control signal CTRL in its first state.

In a second phase, beginning when the first voltage threshold is reached, that is to say when the voltages at the first and second nodes BE1 and BE2 are equal, the second comparator CMP2 delivers the first signal SIG1 having a high state.

Thus, the inputs of the logic gate PL are both in the high state, and the logic gate PL, the output of which is coupled to the first output node BS1, delivers the control signal CTRL having a high state.

On reception of the control signal CTRL having the second value, the circuit CI begins its operation, the switch INT switches to the closed position, and the amplifier AMP and the third comparator CMP3 are activated.

Thus, the first input E31 of the third comparator CMP3, coupled to the second output node BS2, receives the band gap voltage Vbg, which is here equal to the first threshold, and which is therefore in the second phase lower than the power supply voltage Vcc received on the second input E32.

The third comparator CMP3 therefore continues to deliver the second signal SIG2 having a low state.

Since the amplifier AMP has a higher gain, it imposes the band gap voltage on the intermediate node NI, here 1.2 Volts. And, if the power supply voltage Vcc decreases to pass once again below the first threshold, then the third comparator CMP3 delivers the second signal SIG2 having a high state.

The inverting gate PI therefore delivers a high state, and the inputs of the logic gate PL of AND type are therefore different.

The logic gate PL therefore delivers the control signal CTRL having the first state, here a low state, and the circuit CI then ceases its operation.

It is also possible to define a second threshold, lower than the first voltage threshold, used when the power supply voltage drops.

That advantageously makes it possible to avoid phenomena of oscillation of the device when the value of the power supply voltage reaches the voltage threshold, and therefore make the device more stable.

Figure 5:
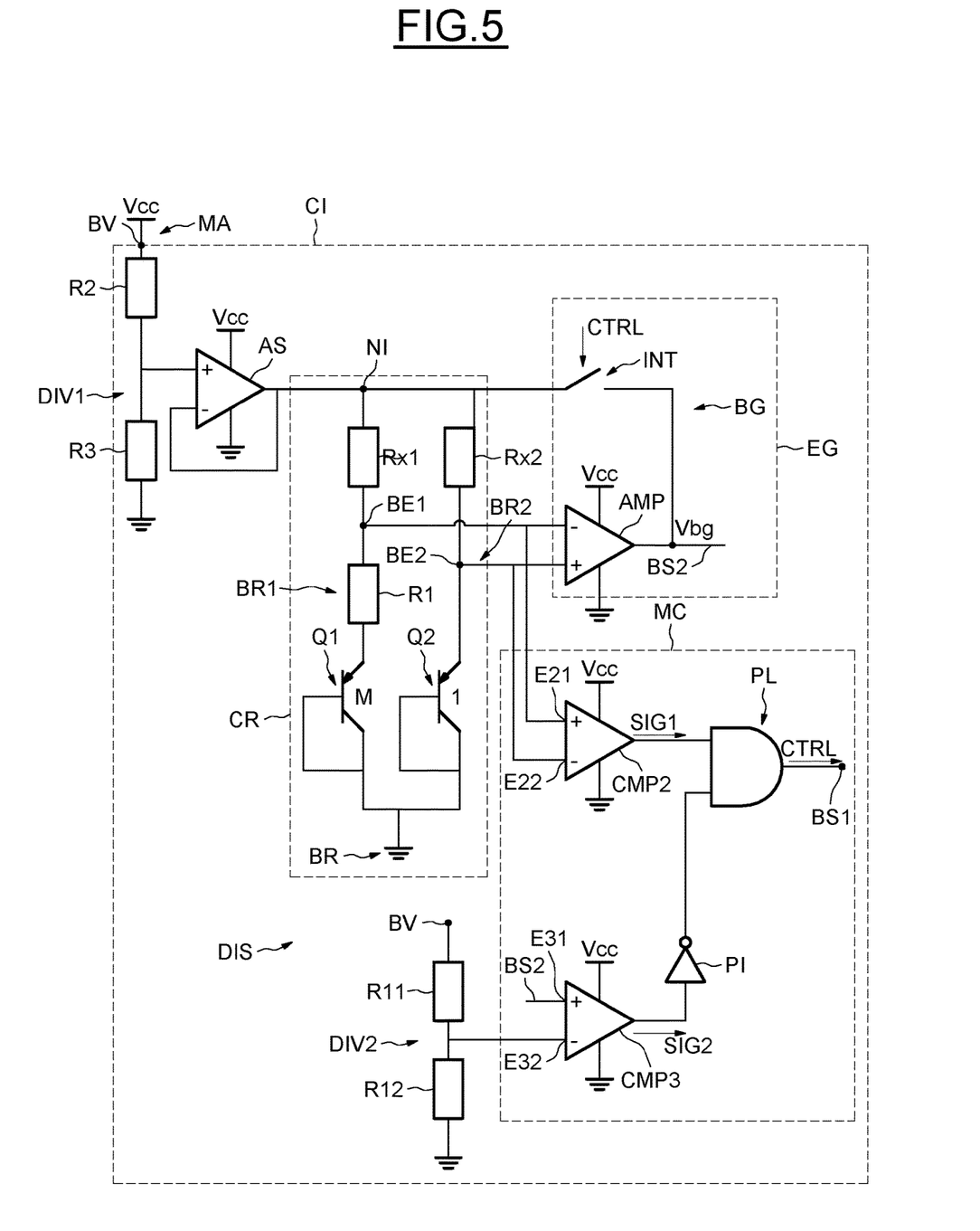

As FIG. 5 illustrates, for that, the voltage power supply module MA should comprise the first voltage divider bridge DIV1 in order that the first threshold is greater than the band gap voltage.

Here, the second input E32 of the third comparator CMP3 is coupled to the power supply node BV via a second voltage divider bridge DIV2 delivering a voltage equal to the power supply voltage Vcc divided by a first factor.

The second voltage divider bridge DIV2 here comprises a first bridge resistor R11 and a second bridge resistor R12, the values of which are chosen such that the second voltage threshold multiplied by said first factor is equal to the band gap voltage.

It would however be possible to choose a second threshold equal to the band gap voltage, and in this case the second input E32 of the third comparator CMP3 would be directly coupled to the power supply node BV.

The invention is not limited to the embodiments which have just been described but encompasses all the variants.

Thus, the invention is compatible with any core structure and any voltage power supply module structure.

The invention claimed is:
1. An electronic circuit, comprising:
a power supply node configured to receive a power supply voltage;
an output node; and
a device configured to monitor the power supply voltage comprising:
a band gap voltage generator core coupled to the power supply node and including a first node and a second node;

a control circuit connected to the first and second nodes of the band gap voltage generator core and configured to deliver, on the output node, a control signal having:
a first state when an increasing power supply voltage is below a first threshold;
a second state when the increasing power supply voltage becomes greater than or equal to the first threshold, the first threshold being greater than a band gap voltage; and
the first state when a decreasing power supply voltage falls below the first threshold; and
a voltage power supply module configured to supply the band gap voltage generator core at an intermediate node with a voltage derived from the power supply voltage, wherein the voltage power supply module includes a resistive module coupled between the power supply node and the intermediate node.

2. The circuit according to claim 1, wherein the intermediate node receives the power supply voltage.

3. The circuit according to claim 1, wherein the band gap voltage generator core comprises:
first and second circuit branches respectively coupled to the first and second nodes and respectively comprising diode-mounted PNP bipolar transistors configured to exhibit different current densities;
a first resistor in one of the first and second circuit branches which exhibits a higher current density; and
two auxiliary resistors respectively connected to the first and second nodes and having a common node at an intermediate node which receives a voltage derived from the power supply voltage.

4. The circuit according to claim 1, wherein the control circuit comprises: a first comparator having a first input coupled to the first node, a second input coupled to the second node, and an output coupled to the output node.

5. The circuit according to claim 1, further comprising an equalization circuit having a first input coupled to the first node, a second input coupled to the second node and an output coupled in feedback to the band gap voltage generator core, the equalization circuit being deactivated when the control signal is in its first state and being activated when the control signal is in its second state to deliver the band gap voltage at the output of the equalization circuit.

6. The circuit according to claim 5, further comprising a switch coupled in series with the feedback, wherein actuation of said switch is controlled by the control signal.

7. The circuit according to claim 5, where the output of the equalization circuit is coupled in feedback to the band gap voltage generator core at the intermediate node.

8. The circuit according to claim 5, wherein the control circuit comprises:
a first comparator having a first input coupled to the first node, a second input coupled to the second node, and an output is configured to generate a first signal when the power supply voltage is greater than or equal to the first voltage threshold;
a second comparator having a first input coupled to receive the band gap voltage, a second input coupled to the power supply node, and an output is configured to generate a second signal when the power supply voltage is greater than or equal to the first threshold; and
a logic circuit configured to logically combine the first and second signals to generate the control signal.

9. The circuit according to claim 8, wherein the logic circuit comprises:
an inverter configured to invert the second signal; and an AND gate having a first input configured to receive the first signal and a second input configured to receive the inverted second signal.

10. The circuit according to claim 8, wherein the control circuit is configured to deliver the control signal in the first state when a decreasing power supply voltage falls below a second threshold that is lower than the first threshold.

11. The circuit according to claim 10, wherein the second input of the second comparator is coupled to the power supply node via a voltage divider bridge, so that the second comparator is configured to generate the second signal when the power supply voltage is greater than or equal to a second voltage threshold, the second voltage threshold being different from the first voltage threshold.

12. The circuit according to claim 1, wherein a first voltage and a second voltage are respectively generated at the first and second nodes from first and second currents passing through circuitry of the band gap voltage generator core having two different current densities.

13. An electronic circuit, comprising:
a power supply node configured to receive a power supply voltage;
an output node; and
a device configured to monitor the power supply voltage comprising:
a band gap voltage generator core coupled to the power supply node and including a first node and a second node;
a control circuit connected to the first and second nodes of the band gap voltage generator core and configured to deliver, on the first output node, a control signal having:
a first state when an increasing power supply voltage is below a first threshold; and
a second state when the increasing power supply voltage becomes greater than or equal to the first threshold, the first threshold being at least equal to a band gap voltage; and
an equalization circuit having a first input coupled to the first node, a second input coupled to the second node and an output coupled in feedback to the band gap voltage generator core, the equalization circuit being deactivated when the control signal is in its first state and being activated when the control signal is in its second state to deliver the band gap voltage at the output of the equalization circuit.

14. The circuit according to claim 13, further comprising a voltage power supply module configured to supply the band gap voltage generator core at an intermediate node with a voltage derived from the power supply voltage.

15. The circuit according to claim 14, wherein the intermediate node receives the power supply voltage, and the first threshold is equal to the band gap voltage.

16. The circuit according to claim 14, wherein the voltage power supply module includes a resistive module coupled between the power supply node and the intermediate node, and the first voltage threshold is greater than the band gap voltage.

17. The circuit according to claim 13, wherein the band gap voltage generator core comprises:
first and second circuit branches respectively coupled to the first and second nodes and respectively comprising diode-mounted PNP bipolar transistors configured to exhibit different current densities;
a first resistor in one of the first and second circuit branches which exhibits a higher current density; and two auxiliary resistors respectively connected to the first and second nodes and having a common node at an intermediate node which receives a voltage derived from the power supply voltage.

18. The circuit according to claim 13, wherein the control circuit comprises: a first comparator having a first input coupled to the first node, a second input coupled to the second node, and an output coupled to the first output node.

19. The circuit according to claim 13, further comprising a switch coupled in series with the feedback, wherein actuation of said switch is controlled by the control signal.

20. The circuit according to claim 13, where the output of the equalization circuit is coupled in feedback to the band gap voltage generator core at an intermediate node which receives a voltage derived from the power supply voltage.

21. The circuit according to claim 13, wherein the control circuit comprises:
a first comparator having a first input coupled to the first node, a second input coupled to the second node, and a first output is configured to generate a first signal when the power supply voltage is greater than or equal to the first voltage threshold;
a second comparator having a first input coupled to receive the band gap voltage, a second input coupled to the power supply node, and a second output is configured to generate a second signal when the power supply voltage is greater than or equal to the first threshold; and
a logic circuit configured to logically combine the first and second signals to generate the control signal.

22. The circuit according to claim 21, wherein the logic circuit comprises:
an inverter configured to invert the second signal; and
an AND gate having a first input configured to receive the first signal and a second input configured to receive the inverted second signal.

23. The circuit according to claim 21, wherein the control circuit is configured to deliver the control signal in the first state when a decreasing power supply voltage falls below a second threshold that is lower than the first threshold.

24. The circuit according to claim 23, wherein the second input of the second comparator is coupled to the power supply node via a voltage divider bridge, so that the second comparator is configured to generate the second signal when the power supply voltage is greater than or equal to a second voltage threshold, the second voltage threshold being different from the first voltage threshold.

25. The circuit according to claim 13, wherein a first voltage and a second voltage are respectively generated at the first and second nodes from first and second currents passing through circuitry of the band gap voltage generator core having two different current densities.

26. An electronic circuit, comprising:
a power supply node configured to receive a power supply voltage;
an output node; and
a device configured to monitor the power supply voltage comprising:
a band gap voltage generator core coupled to the power supply node and including a first node and a second node;
a control circuit connected to the first and second nodes of the band gap voltage generator core and configured to deliver, on the output node, a control signal having:
a first state when an increasing power supply voltage is below a first threshold; and
a second state when the increasing power supply voltage becomes greater than or equal to the first threshold, the first threshold being at least equal to a band gap voltage;
wherein the control circuit comprises:
a first comparator having a first input coupled to the first node, a second input coupled to the second node, and a first output configured to generate a first signal when the power supply voltage is greater than or equal to the first voltage threshold;
a second comparator having a first input coupled to receive the band gap voltage, a second input coupled to the power supply node, and a second output configured to generate a second signal when the power supply voltage is greater than or equal to the first threshold; and
a logic circuit configured to logically combine the first and second signals to generate the control signal at the output node.

27. The circuit according to claim 26, wherein the logic circuit comprises:
an inverter configured to invert the second signal; and
an AND gate having a first input configured to receive the first signal and a second input configured to receive the inverted second signal.

28. The circuit according to claim 26, wherein the control circuit is configured to deliver the control signal in a first logic state when a decreasing power supply voltage falls below a second threshold that is lower than the first threshold.

29. The circuit according to claim 28, wherein the second input of the second comparator is coupled to the power supply node via a voltage divider bridge, so that the second comparator is configured to generate the second signal when the power supply voltage is greater than or equal to a second voltage threshold, the second voltage threshold being different from the first voltage threshold.

30. The circuit according to claim 26, further comprising a voltage power supply module configured to supply the band gap voltage generator core at an intermediate node with a voltage derived from the power supply voltage.

31. The circuit according to claim 30, wherein the intermediate node receives the power supply voltage, and the first threshold is equal to the band gap voltage.

32. The circuit according to claim 30, wherein the voltage power supply module includes a resistive module coupled between the power supply node and the intermediate node, and the first voltage threshold is greater than the band gap voltage.

33. The circuit according to claim 26, wherein the band gap voltage generator core comprises:
first and second circuit branches respectively coupled to the first and second nodes and respectively comprising diode-mounted PNP bipolar transistors configured to exhibit different current densities;
a first resistor in one of the first and second circuit branches which exhibits a higher current density; and
two auxiliary resistors respectively connected to the first and second nodes and having a common node at an intermediate node which receives a voltage derived from the power supply voltage.

34. The circuit according to claim 26, wherein a first voltage and a second voltage are respectively generated at the first and second nodes from first and second currents passing through circuitry of the band gap voltage generator core having two different current densities.

* * * * *

UNITED STATES PATENT AND TRADEMARK OFFICE
CERTIFICATE OF CORRECTION

PATENT NO. : 10,560,089 B2
APPLICATION NO. : 16/161531
DATED : February 11, 2020
INVENTOR(S) : Nicolas Borrel et al.

Page 1 of 1

It is certified that error appears in the above-identified patent and that said Letters Patent is hereby corrected as shown below:

In the Claims

At Column 10, Claim No. 13, Line 32, please delete the word "first".

Signed and Sealed this
Seventeenth Day of November, 2020

Andrei Iancu
*Director of the United States Patent and Trademark Office*